United States Patent
Broman et al.

(10) Patent No.: US 6,819,569 B1
(45) Date of Patent: Nov. 16, 2004

(54) IMPEDANCE EQUALIZATION MODULE

(75) Inventors: Mark Hamilton Broman, Mankato, MN (US); Mike Howieson, Good Thunder, MN (US); Brent Randel Huibregtse, Mankato, MN (US); Tsuguhiko Takamura, North Mankato, MN (US)

(73) Assignee: Thin Film Technology Corp., North Mankato, MN (US)

( * ) Notice: Subject to any disclaimer, the term of this patent is extended or adjusted under 35 U.S.C. 154(b) by 0 days.

(21) Appl. No.: 10/313,215

(22) Filed: Dec. 6, 2002

(51) Int. Cl.[7] .................................................. H05K 5/06
(52) U.S. Cl. ........................ 361/752; 361/797; 361/763; 361/811
(58) Field of Search .............................. 361/752, 763, 361/811, 830, 520, 776, 797, 821

(56) References Cited

U.S. PATENT DOCUMENTS

| | | | | |
|---|---|---|---|---|
| 4,695,115 A | * | 9/1987 | Talend | 439/76.1 |
| 5,851,895 A | * | 12/1998 | Weekamp et al. | 438/384 |
| 5,977,631 A | * | 11/1999 | Notani | 257/728 |
| 6,102,747 A | * | 8/2000 | Paagman | 439/701 |
| 6,285,542 B1 | * | 9/2001 | Kennedy et al. | 361/328 |
| 6,380,826 B1 | | 4/2002 | Palinkas | |
| 6,404,003 B1 | * | 6/2002 | McMillan et al. | 257/306 |
| 6,407,929 B1 | | 6/2002 | Hale | |
| 6,464,529 B1 | * | 10/2002 | Jensen et al. | 439/405 |

FOREIGN PATENT DOCUMENTS

DE 3125281 A1 * 1/1983

* cited by examiner

Primary Examiner—David Martin
Assistant Examiner—Hung S. Bui
(74) Attorney, Agent, or Firm—DL Tschida

(57) ABSTRACT

A thin film circuit module for terminating circuit conductors at printed and transmission line circuits. In one form of equalizer construction, thin film circuit elements are deposited on a supporting substrate and wherein one of the capacitor plates defines a circuit resistor. The equalizer modules are serially coupled to trace conductors of a connector block. Another hybrid equalizer construction includes thin film resistors and pick-and-placed capacitors.

7 Claims, 8 Drawing Sheets

IMPEDANCE EQUALIZATION MODULE

BACKGROUND OF THE INVENTION

The present invention relates to passive thin film devices that compensate for signal losses over trace conductors at printed circuit assemblies and/or connectors and/or transmission lines and passively augment the impedance characteristic of the relevant conductive pathway, among other applications.

Dielectric and conductor losses, cross talk, reflections and noise, among a variety of other parasitic and signal degrading conditions, can impair operation of high frequency digital circuits, such as used in many telecommunication and networking applications. These problems are especially apparent at frequencies and data transfer rates in excess of 1.0 GHz, where reduced performance means reduced bandwidth and more hardware to achieve any desired result.

Cross talk can develop between signal lines and reflections and noise can develop from terminations. The resultant losses or signal attenuation, noise and cross talk can distort and reduce the fidelity of transmitted data signals. Delays can also occur with a resultant loss of synchronization in data conveyed between data supply conductors and responding circuitry. The degradation of signal fidelity and loss of synchronization make it difficult to distinguish the information content of transmitted data. High frequency circuit designers therefore expend considerable effort to minimize sources of noise, cross talk and signal attenuation.

Optical fiber, active repeater/amplifier devices and/or special materials can be used to improve signal integrity. Such devices, however, frequently require increased power and increased physical space for the circuitry. These improvements can also be relatively costly to implement.

Passive devices, such as capacitors or simple RC circuits, have been mounted to the top and bottom surfaces of printed circuit boards in close association to populated circuitry to enhance signal quality. Such mountings can be costly to implement and cannot be readily re-worked, if changes or fine-tuning is required. Embedded capacitors have also been incorporated into integrated circuit packages as shown at U.S. Pat. No. 6,407,929.

The subject invention provides thin film devices or equalization modules constructed of planar copper component features (e.g. passive resistors, capacitors, inductors) and/or hybrid components that, for example, can be coupled to printed circuit assemblies (e.g. mother and daughter boards) to offset losses present in signal carrying conductors. The equalization modules can be coupled to individual trace conductors of a printed circuit assembly to provide a tailored impedance characteristic to passively compensate for inherent high frequency signal degradation. The modules can also be mounted in connectors that couple to a printed circuit assembly to compensate for anticipated high frequency losses over a designed bandwidth at selected trace conductors at the board. Improved signal fidelity and synchronization are thereby achieved over an expanded operational bandwidth

SUMMARY OF THE INVENTION

It is a primary object of the present invention to provide a passive thin film device that can be coupled to compensate for signal attenuation and degradation occurring in conductors conveying signals at gigahertz frequencies.

It is a further object of the invention to provide a device that includes thin film capacitor(s) and resistor(s) deposited on a ceramic substrate and wherein a thin film capacitor plate separately defines a device resistor.

It is a further object of the invention to provide a connector to a printed circuit assembly and/or cable containing several equalizer devices.

Various of the foregoing objects, advantages and distinctions of the invention are found in a passive, thin film module having one or more input and output terminations to a shunt resistor/capacitor pair constructed on a ceramic substrate and wherein a thin film capacitor plate separately defines a device resistor. A printed circuit connector is also disclosed that includes several modules tailored to compensate for signal loss/degradation at a coupled connector. Several of the foregoing equalizers of predetermined values are serially mounted to individual conductive paths or connector ports of a board/cable connector to compensate for anticipated trace conductor losses at a mating printed circuit assembly.

In another equalizer module construction, a multi-port, hybrid thin-film, RC filter circuit module configured on a ceramic substrate and used to improve impedance characteristic of transmission lines and/or trace conductors.

Still other objects, advantages and distinctions of the invention will become more apparent from the following description with respect to the appended drawings. Considered alternative constructions, improvements or modifications are described as appropriate. The description should not be literally construed in limitation of the invention. Rather, the scope of the invention should be broadly interpreted within the scope of the further appended claims.

BRIEF DESCRIPTION OF THE DRAWINGS

Similar reference numerals and characters at the drawings refer to like structure at the various drawings and which are as follows.

DESCRIPTION OF THE PREFERRED EMBODIMENT

Referring to FIGS. 1–4, views are shown to a passive thin film equalizer device 2. The device 2 can be coupled to conductors conveying signals at frequencies in excess of 1.0 GHZ to reduce conductor losses and improve signal integrity. The device 2 is typically constructed to condition a specific length of conductor. Longer conductors can be conditioned with several displace, serially arranged devices.

Figure 1:
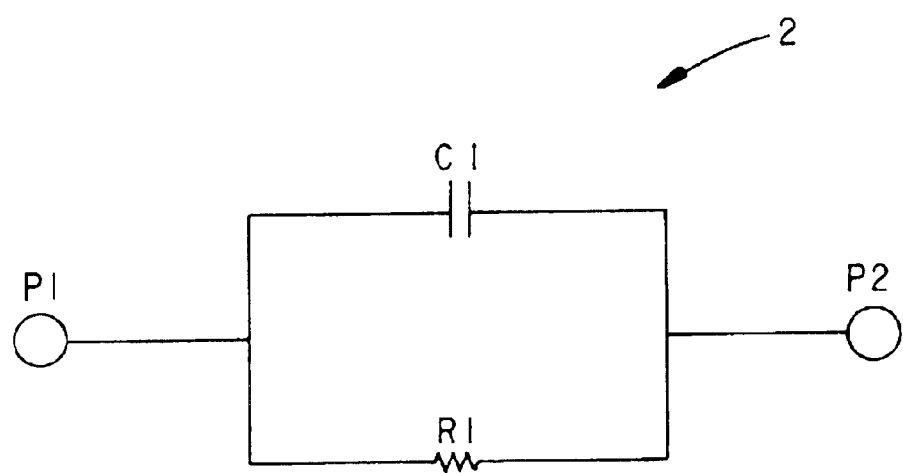
FIG. 1 shows a circuit schematic of an equalizer module that can be coupled to compensate for a lossy signal conductor (e.g. printed circuit trace, transmission line).

With attention to FIG. 1, the device 2 includes a capacitor element C1 and resistor element R1 that are coupled in parallel relative to input and output ports P1 and P2. The device 2 is typically coupled in series with a conductive path that is being conditioned, for example a printed circuit trace conductor or transmission line. The ports P1 and P2 can be coupled at any convenient location along the conductive path, including printed circuit terminations, such as in associated connectors.

Depending upon the length of the lossy conductor, the values of R1 and C1 can be sized as desired to provide a suitable equalization. Presently preferred devices 2 respectively provide component values for R1 in the range of 10 to 250 ohms and a C1 in the range of 0.5 to 10 picofarads (pf) with a respective dielectric thickness of 1 to 3 microns. Some presently preferred modules 2 provide respective R1 values of 10, 25 and 35 ohms, C1 values of 3, 5 and 8 pf and a ceramic dielectric thickness of 2.95, 1.77 and 1.105 $\mu$m. The circuit components can be constructed from a variety of compatible organic or inorganic substrate materials, including engineering grade polymers such as liquid crystal molding compounds (e.g. Ticona E530i).

Figure 2:
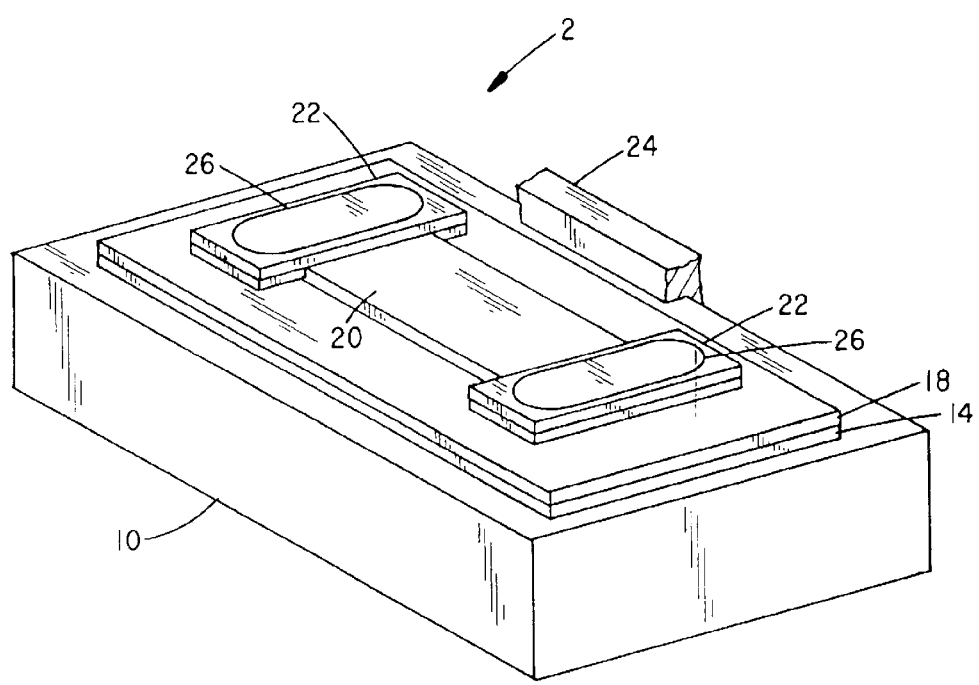
FIG. 2 is a perspective view of a thin film equalization module exhibiting the circuit of FIG. 1, prior to packaging.
Figure 3:
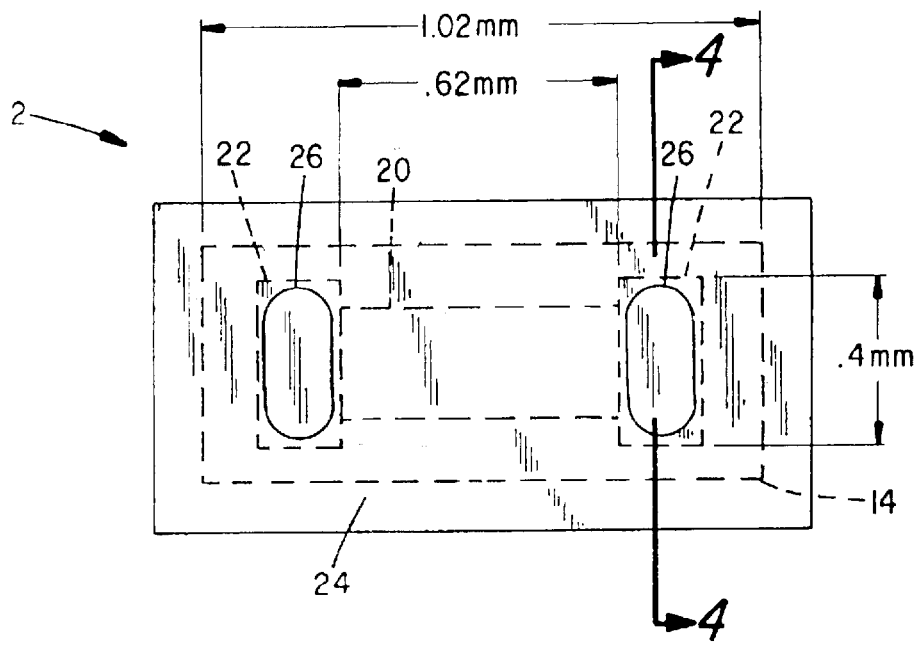
FIG. 3 is a top plan view of the equalization module of FIG. 2.
Figure 4:
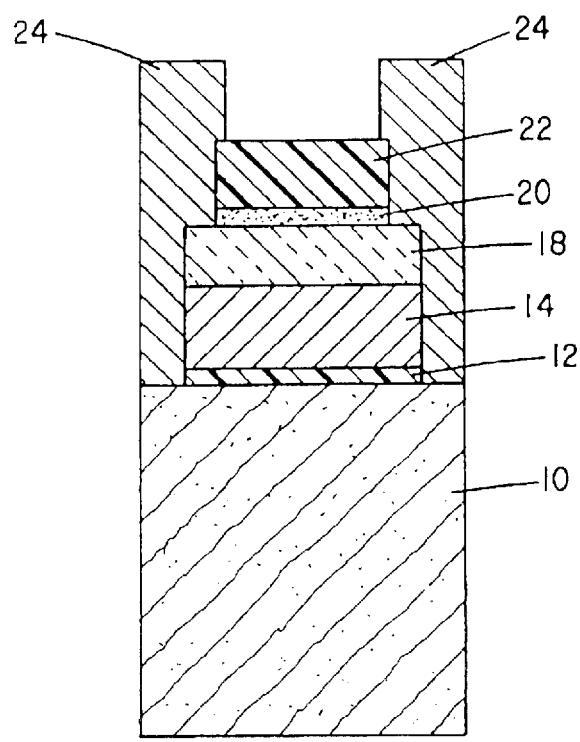
FIG. 4 is a cross section view taken along sections lines 4—4 through the equalization module of FIG. 2.

FIG. 2 depicts a perspective view of the unassembled device 2. FIGS. 3 and 4 depict a top plan view and a cross section view taken along section lines 4—4 of FIG. 3. With particular attention to FIG. 4, the device 2 is presently constructed on a ceramic substrate 10.

A NiCr adhesion layer 12 is first deposited over an aluminum oxide substrate 10. A layer of copper 14 is deposited over the adhesion layer 12. The layers 12 and 14 are chemically etched to desired shapes. The layer 14 defines the bottom plate of the capacitor C1. A suitable dielectric layer 18, e.g. tantalum oxide, silicon dioxide, or silicon nitride, is next deposited over the layer 14 and plasma etched to size and shape. A NiCr resistive layer 20 is next deposited over the dielectric layer 18 and which layer 20 becomes the resistor R1. The resistance value of R1 can be adjusted by changing the material resistivity, thickness and geometry of the layer 20 by chemical etching or other appropriate techniques. The NiCr layer 20 is presently constructed from 80-ohms/square or 160-ohms/square material and the length and the width of the layer 20 are 0.62 mm (length)×0.285 mm or 0.400 mm (width).

A copper layer 22 is next deposited over the NiCr layer 20. The copper layer 22 and the NiCr resistive layer 20 collectively define the top capacitor plate. The layer 22 is etched into two separated portions and which portions are separated 1.020 mm A photolithographic passivation layer 24 is then applied over the entire layered assembly to physically and electronically protect the device 2. Openings 26 are developed out after the exposure and which openings 26 are available to form the electrical termination pads P1 and P2. Conductive epoxy or other electrical connection materials (e.g. tin/lead solder or gold) can be filled or plated into the openings 26. The terminations can be constructed in conventional fashion to achieve any desired type of mounting required for any particular application.

Figure 5A:
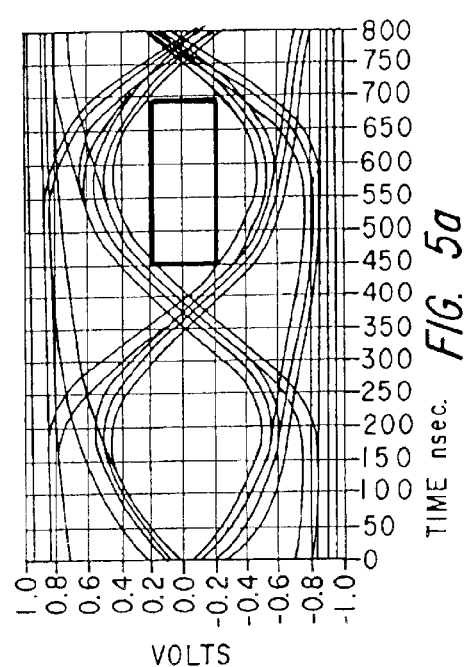
FIG. 5a shows a simulated signal waveform for a 20-inch length of trace conductor subjected to a 2.5 Gbit/sec pseudorandom data stream relative to an industry-defined window.
Figure 5B:
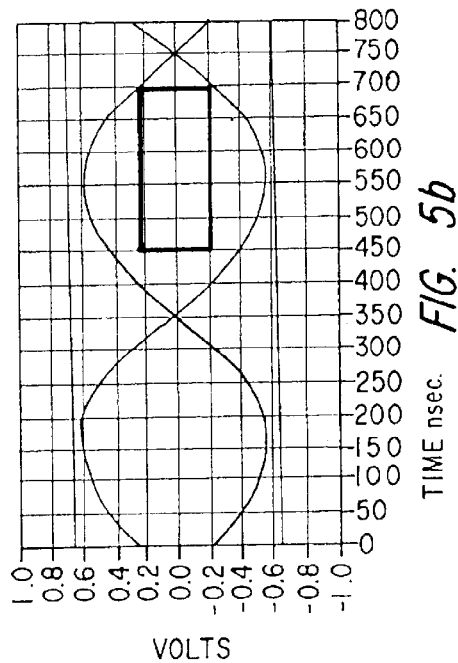
FIG. 5b shows the improvement in signal transmissions for the trace conductor simulated in FIG. 5a after being serially coupled to an equalizer module of the type shown in FIGS. 1–4.

With attention next directed to FIGS. 5a, 5b and 6a, 6b, computer simulated waveforms developed upon coupling pseudorandom data streams or test signals at gigahertz frequencies are shown. FIGS. 5a and 5b depict before and after "eye" waveforms that were developed in relation to a simulated 20-inch back panel trace conductor simulated to standard industry specifications and subjected to a 2.5 gigabit per second (Gb/s), pseudorandom data stream. The rectangular box exemplifies a minimal, industry standard signal separation that must be maintained to detect "1's" and "0's". Losses and jitter that develops in the signals as they pass through the conductor are apparent at FIG. 5a from the differing high/low and time-shifted transitions.

FIG. 5b depicts an "eye" pattern developed for the same simulated trace conductor but including a suitable serially coupled equalizer 2. The substantially reduced variation in signal transitions provides a relatively well-defined "eye" pattern. The additional space between the box and the signals at the "0 db" cross over line infers that the trace conductor/equalizer combination is capable conducting higher frequency signals through the trace conductor before the signals will again degrade below accepted industry standards.

Figure 6A:
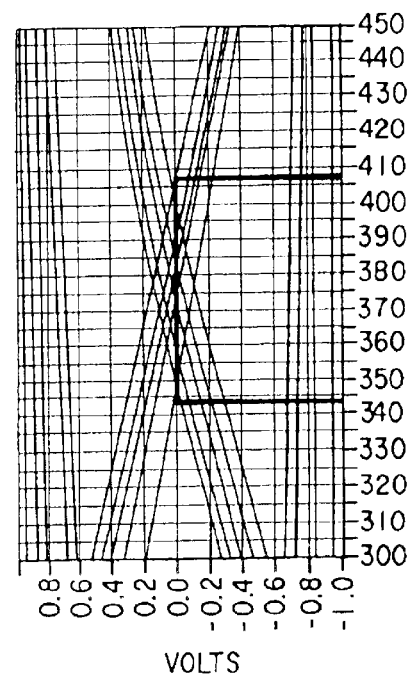
FIG. 6a shows a detailed view of the signal crossover point for a simulated 20-inch length of trace conductor subjected to a 2.5 Gbit/sec pseudorandom bit stream relative to an industry-defined window.
Figure 6B:
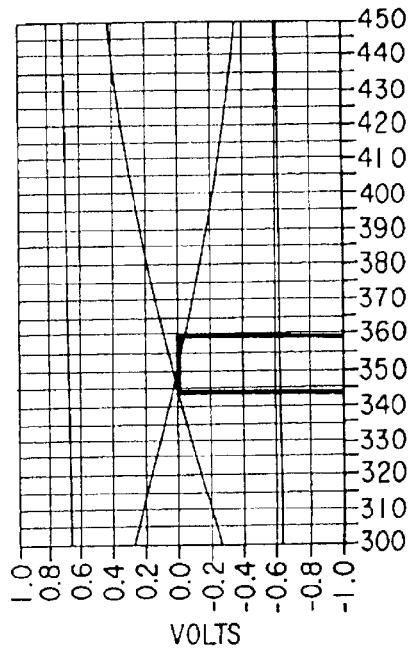
FIG. 6b shows the improvement in signal transmissions for the trace conductor simulated in FIG. 6a after being serially coupled to an equalizer module of the type shown in FIGS. 1–4.

FIGS. 6a and 6b depict detailed views of the signal crossover point and the relative jitter (i.e. time shifting) on a horizontal time scale in relation to exemplary rectangular boxes for other representative industry standards. The FIGS. 6a and 6b waveforms were developed for the same simulated 20-inch trace conductor and equalizer 2. The improved, relatively narrowed reference box at FIG. 6b again demonstrates that higher frequencies can be applied to the equalized trace conductor before signal degradation would overcome the signal conditioning obtained with the equalizer device 2.

Figure 7:
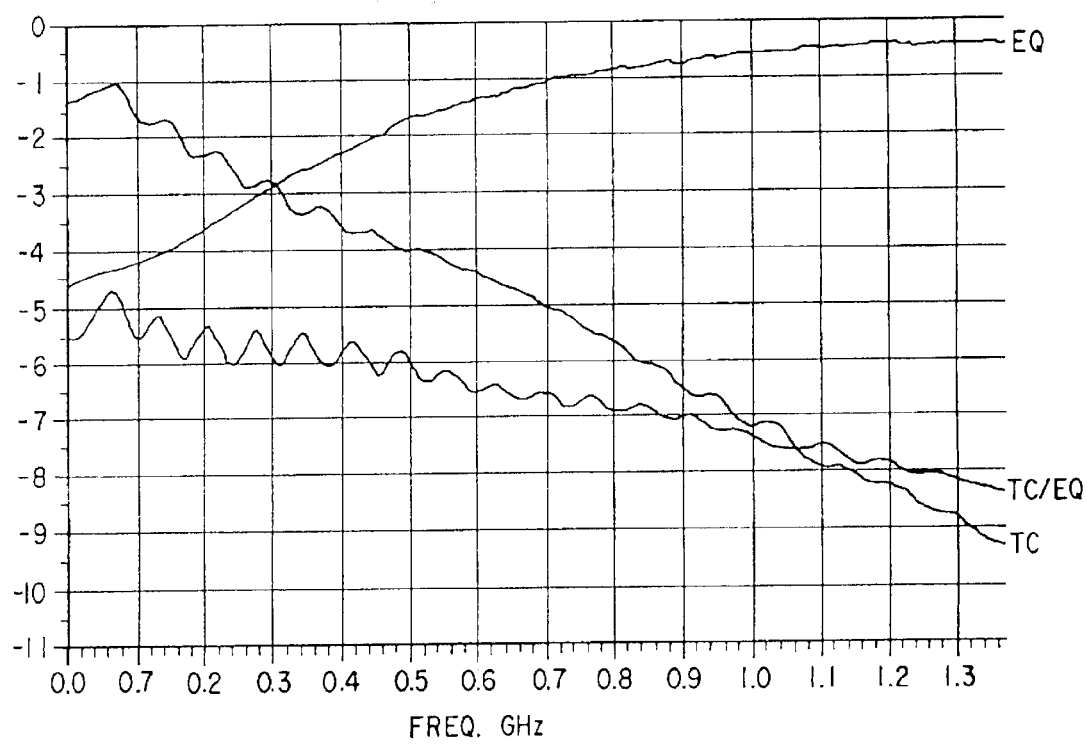
FIG. 7 shows actual measured loss waveforms for a sample 20-inch trace conductor (TC), an equalizer module (EM) and the trace conductor when serially coupled to the equalizer module (TC/EM).

FIG. 7 depicts actually measured loss data for an equalizer device 2 wherein R1=45 ohm and C1=10 pf and a 20-inch length of industry standard trace conductor. Measurements were taken over a frequency range up to 14 GHz. The "TC" waveform exhibits the measured loss for the trace conductor alone. The "EQ" waveform exhibits the measured loss for the equalizer module 2 alone. And the "TC/EQ" waveform exhibits the measured loss for the combination of the trace conductor and equalizer. The "TC/EQ" waveform demonstrates the substantially improved frequency stability of the equalizer conditioned trace conductor and confirms the improvements simulated at FIGS. 5a, 5b and 6a, 6b.

Figure 8:
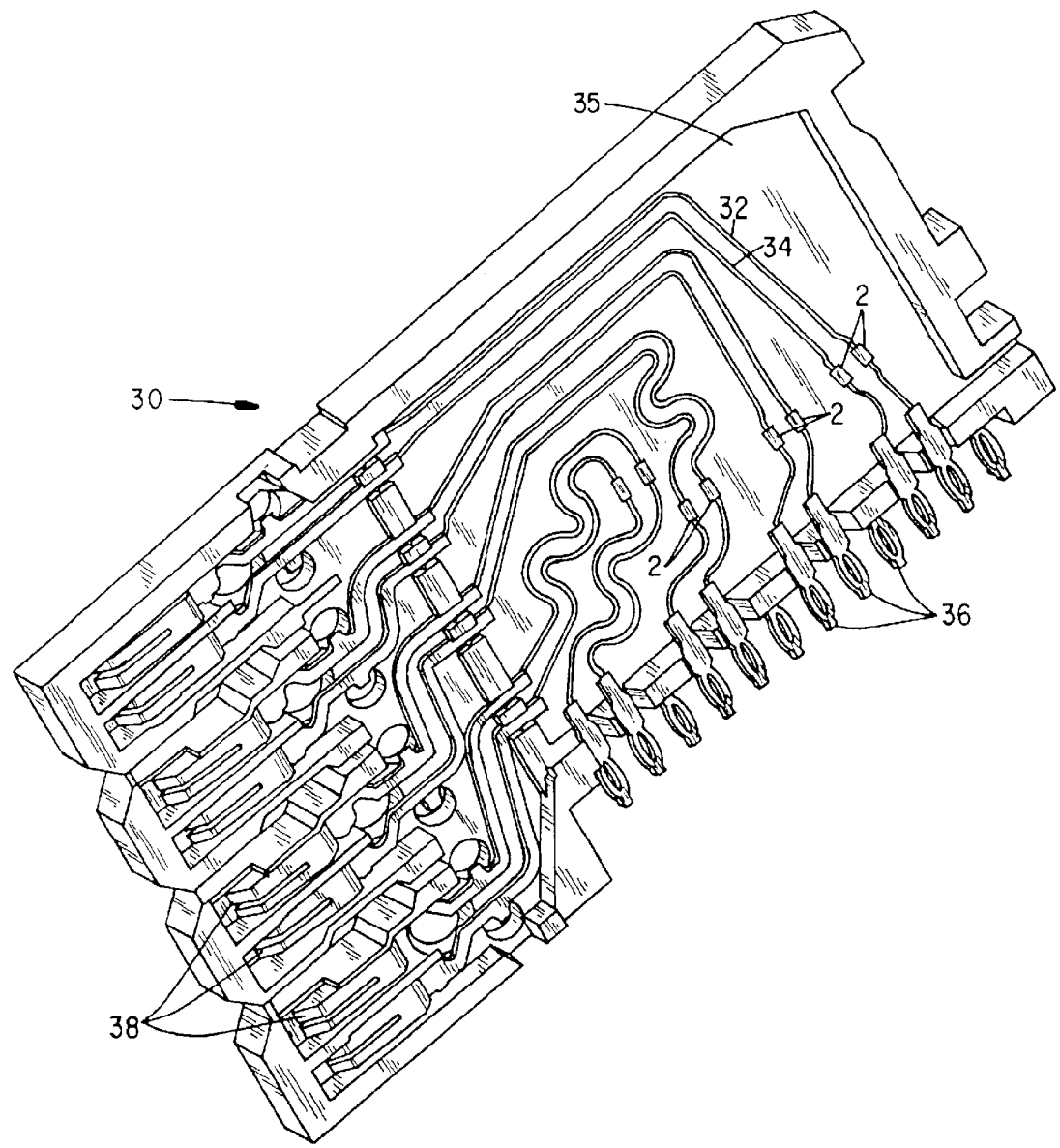
FIG. 8 shows a differential, back panel trace pair connector outfitted with a number of equalizers mounted to internal trace conductors.

FIG. 8 depicts one plate assembly 30 that attaches to a number of other plates and a cable for a back panel connector block. The plate assembly 30 includes a number of differential trace conductors 32 and 34 that extend between termination pins 36 and 38. The conductors 32 and 34 are formed on an appropriate insulative substrate 35 (e.g. epoxy pc board). Serially mounted in surface mount packages at gaps in the conductor traces 32 and 34 are a number of equalizer devices 2. The RC values of the devices 2 are judiciously selected to be compatible with differing lengths of trace conductors (not shown) at a "mother board" or "back panel" (not shown) and to which the pins 36 are affixed. The equalizers 2 are selected such that the back panel trace conductors are conditioned to pass the anticipated frequencies of the data signals. Line losses and synchronization differences (i.e. jitter) are thereby minimized over an expanded range of frequencies. Most significantly, the trace conductors are conditioned with a relatively inexpensive part in an economic fashion and without having to rework the mother board or attempt to affix equalizer modules 2 to the board.

Figure 9:
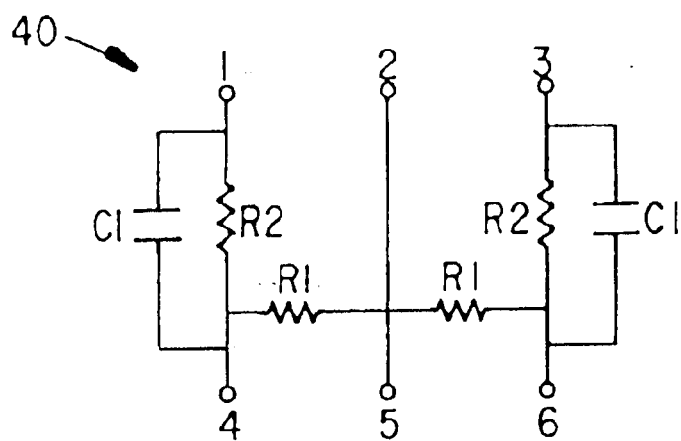
FIG. 9 shows a circuit schematic of a two-port hybrid thin-film equalizer module that can be coupled to a differential pair of signal conductors.
Figure 10:
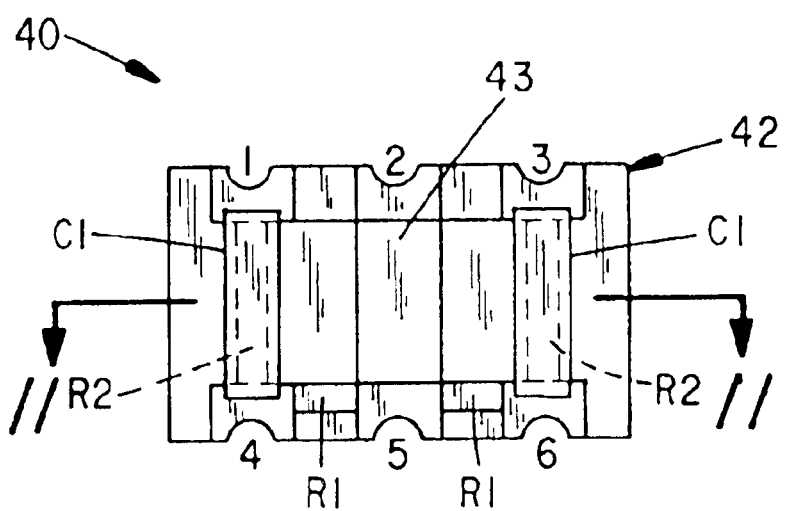
FIG. 10 shows a top plan view of the equalization module of FIG. 9 partially exposed to show the resistors R1 and R2 relative to the capacitors C1 and terminations 1–6.
Figure 11:
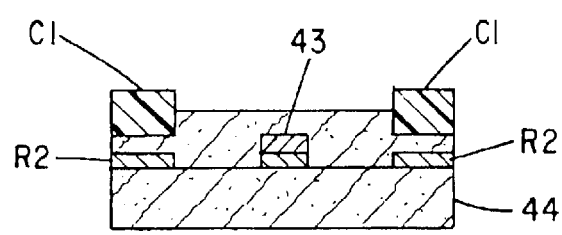
FIG. 11 shows a cross section view taken along sections lines 11—11 through the equalization module of FIG. 9.
Figure 12:
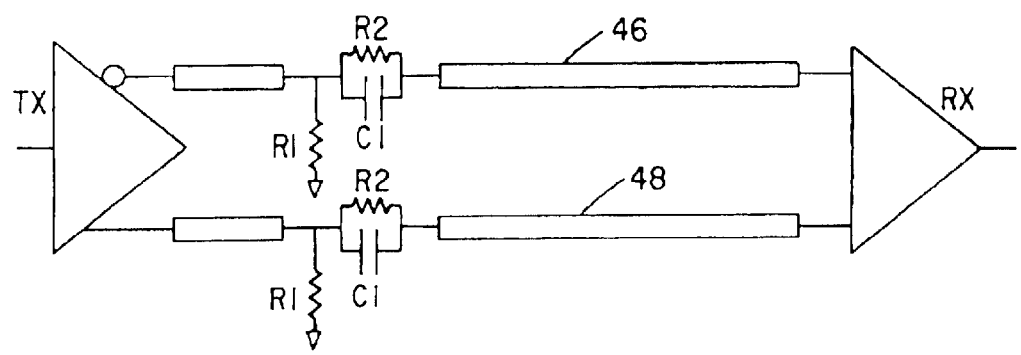
FIG. 12 depicts a schematic of a differential transmission line/transceiver application wherein the equalization module of FIG. 9 has been adapted.

FIGS. 9, 10 and 11 disclose another construction of a two-port equalizer 40 that can be coupled to condition signals directed over differential cable transmission lines 42 and 44 shown at FIG. 11. The equalizer 40 is constructed in a thin-film hybrid configuration. That is and with attention to FIGS. 10 and 11, the resistors R1 and R2 are configured from a thin-film NiCr layer 42 on a substrate 44. Copper termination pads and a bus 43 are deposited over the etched layer 42 and separately constructed capacitors C1 are bonded to the to the layer 42. The assembly 42 is covered with an appropriate passivation material and packaged with appropriate terminals or pads at the terminations 1–6 to accommodate an intended mounting, for example surface or edge mount.

In one presently typical construction, the components of the equalizer are constructed to exhibit values of R1=150 ohm, R2=25 ohm, and C1=30 pF. The equalizer 40 is thereby able to condition 3.25-inch lengths of the transmission lines 46 and 48 to pass signals up to 3.0 GHz.

While the invention has been described with respect to a presently preferred single termination module, it is to be appreciated still other constructions may be suggested to those skilled in the art. For example, each module can accommodate several equalization circuits. The type of termination of each module can be constructed to be compatible with a particular mounting. The circuit arrangement of the passive resistor and/or capacitor components of each module can also be organized differently. The modules can also be coupled to connectors at a cable end, directly to printed circuit assembly or along the length of a cable, conductor or conductive trace. The scope of the invention should therefore be construed broadly within the spirit and scope of the following claims.

What is claimed is:

1. A connector for signals in excess of one gigahertz comprising:
   a) a housing including a plurality of input and output terminals and a circuit support containing a plurality of conductive pathways and wherein said input and output terminals are electrically connected together by said plurality of conductive pathways, and wherein a plurality of said pathways include a discontinuous gap; and
   b) a plurality of thin film modules mounted to said circuit support and serially coupled to bridge each of said gaps in said plurality of conductive pathways, wherein each thin film module supports a passive circuit containing a resistor and a capacitor that exhibits a predetermined signal compensation characteristic to signals in excess of one gigahertz, whereby the frequency bandwidth of pathways containing said thin film modules is increased over pathways not containing said modules.

2. A connector as set forth in claim 1 wherein each of said thin film modules comprises a thin film capacitor and a thin film resistor coupled to each other in parallel and between an input and an output port, wherein a thin film resistor is coupled in shunt to said input port, wherein said input and output ports are coupled to bridge one of said plurality of gaps, and wherein said thin film resistor comprises a plate of said thin film capacitor.

3. A connector as set forth in claim 1 wherein each of said thin film modules comprises a thin film capacitor and a thin film resistor coupled to each other in parallel and between an input and an output port, wherein said input and output ports are coupled to bridge one of said plurality of gaps, and wherein said thin film resistor comprises a plate of said thin film capacitor.

4. A connector as set forth in claim 3 wherein said input terminals of said housing are connected to individual conductors of a multi-conductor cable and said output terminals of said housing are coupled to a plurality of second conductive pathways at a second circuit support and wherein the signal compensation characteristic of each module is selected to passively compensate for signal attenuation at frequencies in excess of one gigahertz at said second conductive pathways.

5. A connector as set forth in claim 1 wherein said input terminals of said housing are connected to individual conductors of a multi-conductor cable and said output terminals of said housing are coupled to a plurality of second conductive pathways at a second circuit support and wherein the signal compensation characteristic of each module passively compensates for signal losses at frequencies in excess of one gigahertz at said second conductive pathways.

6. A connector for high frequency signals comprising:
   a) a housing including a plurality of input and output terminals and a circuit support containing a plurality of conductive pathways, wherein said input and output terminals are electrically connected together by said plurality of conductive pathways and wherein a plurality of said pathways include a discontinuous gap; and
   b) a plurality of thin film modules mounted to said circuit support, wherein each of said thin film modules comprises a thin film capacitor and a thin film resistor coupled to each other in parallel and between an input and an output port, wherein said thin film resistor comprises a plate of said thin film capacitor, wherein said input and output ports of each of said thin film modules are serially coupled to bridge one of said plurality of gaps in said plurality of conductive pathways, and wherein each of said thin film modules passively compensates for signal attenuation at frequencies in excess of one gigahertz at said conductive pathways.

7. A thin film device as set forth in claim 6 wherein said resistor and capacitor of each of said thin film modules are selected to also compensate for signal jitter.

\* \* \* \* \*